United States Patent
Kwon et al.

(10) Patent No.: US 9,839,127 B2
(45) Date of Patent: Dec. 5, 2017

(54) SYSTEM OF PACKAGE (SOP) MODULE AND MOBILE COMPUTING DEVICE HAVING THE SOP

(71) Applicants: Heung Kyu Kwon, Seongnam-si (KR); Kyoung Mook Lim, Hwaseong-si (KR)

(72) Inventors: Heung Kyu Kwon, Seongnam-si (KR); Kyoung Mook Lim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 102 days.

(21) Appl. No.: 14/793,384

(22) Filed: Jul. 7, 2015

(65) Prior Publication Data
US 2016/0113115 A1  Apr. 21, 2016

(30) Foreign Application Priority Data
Oct. 21, 2014 (KR) .................. 10-2014-0142509

(51) Int. Cl.
*H05K 1/18* (2006.01)
*G01R 31/28* (2006.01)
(Continued)

(52) U.S. Cl.
CPC ......... *H05K 1/181* (2013.01); *G01R 31/2884* (2013.01); *G06F 1/1613* (2013.01); *G06F 1/1637* (2013.01); *H01L 23/552* (2013.01); *H01L 25/065* (2013.01); *H05K 1/0268* (2013.01); *H01L 23/3121* (2013.01); *H01L 2224/0401* (2013.01); *H01L 2224/16225* (2013.01); *H01L 2224/16227* (2013.01); *H01L 2224/16235* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2225/06517* (2013.01); *H01L 2225/06596* (2013.01); *H01L 2924/15174* (2013.01); *H01L 2924/15192* (2013.01);
(Continued)

(58) Field of Classification Search
CPC ....................................... H05K 1/181
USPC ....................................... 361/764
See application file for complete search history.

(56) References Cited

U.S. PATENT DOCUMENTS 6,281,578 B1   8/2001 Lo et al.
6,351,391 B1 * 2/2002 Beliveau ............... H01L 23/647
                                                              174/255
(Continued)

FOREIGN PATENT DOCUMENTS

KR        10-0718324       5/2007

OTHER PUBLICATIONS

Amin Ezzeddine, "Introduction to MMIC Technology", IEEE US-Egypt Regional Workshop on Microwave Emerging Technologies, Oct. 2010, p. 12.*

*Primary Examiner* — Hoa C Nguyen
*Assistant Examiner* — Stanley Tso
(74) *Attorney, Agent, or Firm* — Volentine & Whitt, PLLC

(57) ABSTRACT

A system on package SoP module includes a printed circuit board (PCB) having a first side and an opposing second side, a first IC attached to the first side, a second IC attached to the second side. The PCB also provides electrical paths for connecting the first IC and the second IC. Conductors by which the second IC is attached to the PCB also allow for electrical testing of the first IC when the SoP is in a system level state.

11 Claims, 14 Drawing Sheets

(51) Int. Cl.
  *G06F 1/16*    (2006.01)
  *H01L 23/552*  (2006.01)
  *H01L 25/065*  (2006.01)
  *H01L 23/31*       (2006.01)
  *H05K 1/02*        (2006.01)
  *H05K 1/11*        (2006.01)

(52) U.S. Cl.
  CPC ........... *H01L 2924/15313* (2013.01); *H01L 2924/19105* (2013.01); *H01L 2924/19106* (2013.01); *H01L 2924/3025* (2013.01); *H05K 1/0215* (2013.01); *H05K 1/112* (2013.01); *H05K 2201/10159* (2013.01); *H05K 2201/10371* (2013.01); *H05K 2201/10515* (2013.01); *H05K 2201/10545* (2013.01); *H05K 2201/10674* (2013.01); *Y02P 70/611* (2015.11)

(56) References Cited

U.S. PATENT DOCUMENTS

| | | | |
|---|---|---|---|
| 7,208,824 B2 | 4/2007 | Lee et al. | |
| 7,453,704 B2 * | 11/2008 | Tanaka | G06F 1/1616 361/760 |
| 7,851,900 B2 | 12/2010 | Ohsaka et al. | |
| 7,888,795 B2 | 2/2011 | Yoshikawa et al. | |
| 7,935,569 B2 | 5/2011 | Bang et al. | |
| 8,339,797 B2 * | 12/2012 | Maeda | H01G 4/232 361/763 |
| 8,391,018 B2 | 3/2013 | Chandrasekaran et al. | |
| 8,737,080 B2 | 5/2014 | Zhang et al. | |
| 2007/0170425 A1 * | 7/2007 | Tashiro | G01R 31/2863 257/48 |
| 2007/0278601 A1 * | 12/2007 | Goodelle | B81C 1/00333 257/416 |
| 2008/0001268 A1 * | 1/2008 | Lu | H01L 21/6836 257/678 |
| 2009/0184416 A1 | 7/2009 | Degani et al. | |
| 2010/0061056 A1 * | 3/2010 | Searls | H01L 21/563 361/679.56 |
| 2012/0138355 A1 * | 6/2012 | Munoz | H01R 13/6595 174/359 |
| 2012/0217657 A1 | 8/2012 | Huang et al. | |
| 2014/0098505 A1 * | 4/2014 | Baker | H05K 3/284 361/764 |
| 2014/0327490 A1 * | 11/2014 | Marconi | H01P 5/107 333/26 |
| 2015/0181713 A1 * | 6/2015 | Shen | H05K 1/183 361/762 |
| 2015/0221625 A1 * | 8/2015 | Chun | H01L 24/17 257/707 |
| 2015/0235915 A1 * | 8/2015 | Liang | H01L 23/145 361/764 |
| 2015/0280904 A1 * | 10/2015 | Tang | H04L 7/048 714/758 |

\* cited by examiner

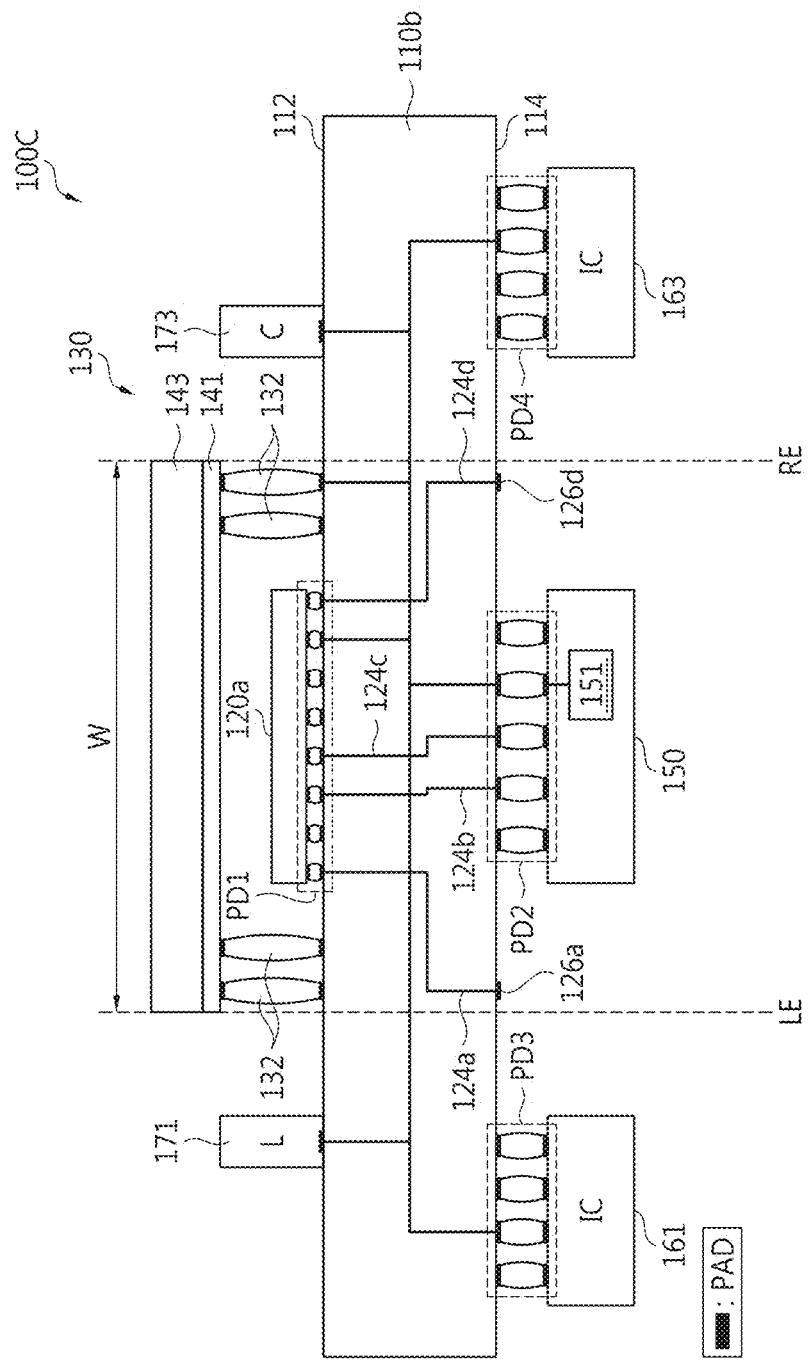

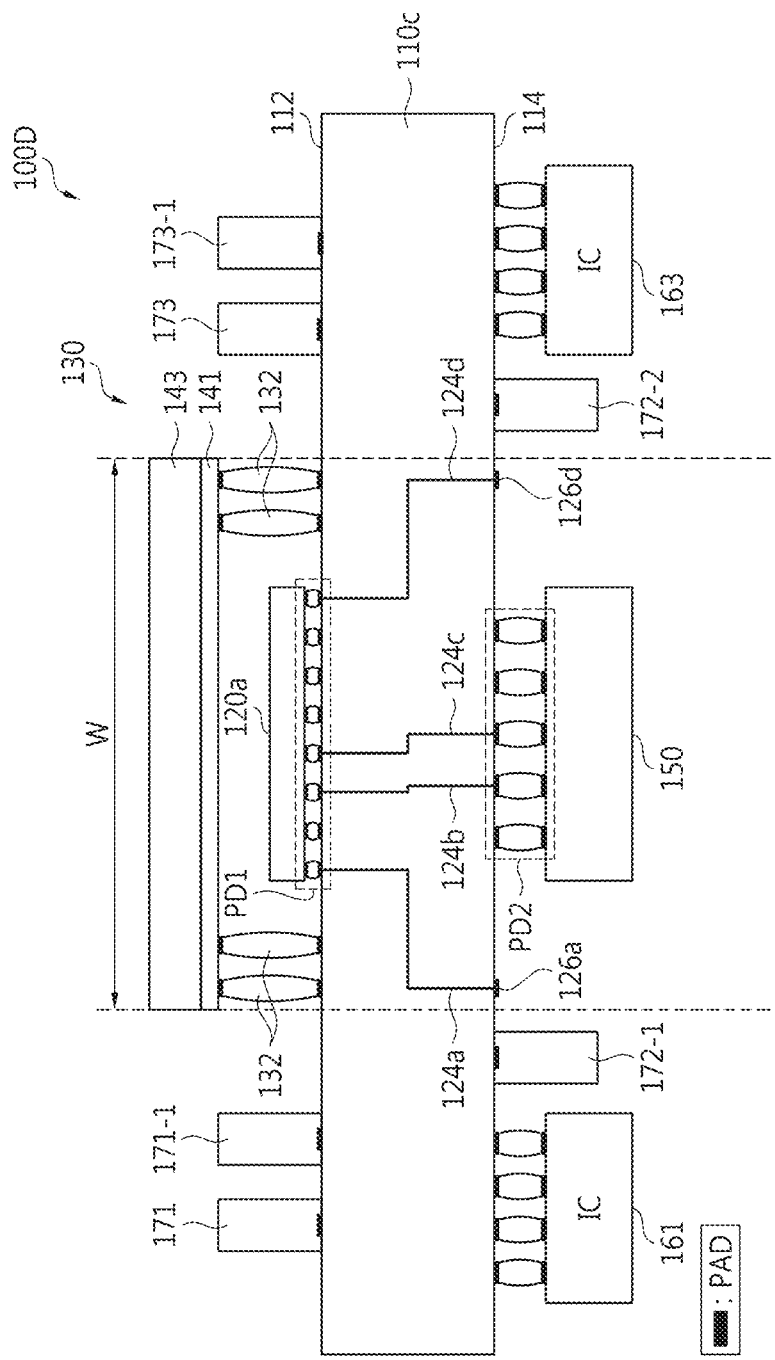

SYSTEM OF PACKAGE (SOP) MODULE AND MOBILE COMPUTING DEVICE HAVING THE SOP

PRIORITY STATEMENT

This application claims priority under 35 U.S.C. §119(a) from Korean Patent Application No. 10-2014-0142509 filed on Oct. 21, 2014, the disclosure of which is hereby incorporated by reference in its entirety.

BACKGROUND

The present inventive concept relates to system on packages (SoP), to mobile computing devices including an SoP, and to methods of fabricating and testing the same.

The technology of forming an integrated circuit on a chip is constantly being developed to meet the needs of today's consumer electronics, such as mobile devices. One such technology is a system-on-chip (SoC). An SoC is a technology in which all of the sub-systems of a computer or like electronic system are provided as an IC on a single die, i.e., in which a single chip contains all of the subsystems of a computer or like electronic system. However, there are certain limits to the functionality and performance that can be achieved by an SoC.

Thus, multi-chip modules (MCMs) have been developed. In an MCM, various types of chips are mounted on a system board and connected to each other by the board. System-in-packages (SiPs) represent a development or class of MCMs in which one or more of the chips are stacked, so as to have a 3D structure, and enclosed or encapsulated on the system board. However, fabricating some of the electronic components of a circuit on semiconductor material, e.g., on a silicon wafer, along with other components of the circuit may be difficult or otherwise problematic. Accordingly, a system-on-package (SoP) is currently being considered and developed. In SoP technology, electronic components which may be difficult to fabricate or integrate with other parts of an IC on a die are fabricated or mounted on the system board apart from chips (bare and/or packaged dies) and are electrically connected to the chips by the board as in SiPs.

In any case, chips and especially SoCs should be tested before being put to use. An SoC is tested using pads of the SoC electrically connected to the electronic subsystems of the SoC. If the SoC passes testing, the SoC may be attached to a system board of an SoP. However, there is no way to test or retest the SoC after it has been attached to the system board of a conventional SoP.

SUMMARY

A representative embodiment of a system on package (SoP) module, according to the inventive concept, includes a printed circuit board (PCB) having a first side and an opposing second side, a first integrated circuit (IC) attached to the first side, and a second IC attached to the second side opposite, and in which the PCB includes electrical paths along which the first IC and the second IC are electrically connected.

A representative embodiment of a system on package (SoP), according to the inventive concept, includes a printed circuit board (PCB), and discrete active and passive electronic components mounted to the PCB apart from one another, and in which respective ones of the active components are disposed on opposite sides of the PCB. Each of the components is electrically connected to at least one other of the components by the PCB. The PCB has first and second opposite sides, and comprises a substrate and electrically conductive paths extending through the substrate from the first side to the second side. The active electronic components comprise a first chip disposed on the first side of and attached to the PCB, and a second chip disposed on the second side of and attached to the PCB. The first chip is electrically connected to the electrically conductive paths of the PCB. The SoP has interconnections comprising conductors disposed on the substrate of the PCB at the second side thereof and electrically connected to the electrically conductive paths. The second chip is attached to the PCB by the conductors, and is electrically connected to the electrically conductive paths by at least some of the conductors so as to be electrically connected to the first chip via the electrically conductive paths. Accordingly, the conductors can be used to test the first chip before the second chip is attached to the PCB.

A representative embodiment of a method of manufacture, for a system on package (SoP), according to the inventive concept, includes providing a sub system assembly, of the system-on-package (SoP), comprising a substrate of a printed circuit board having first and second sides and electrically conductive paths extending between the first and second sides, a first chip mounted on the first side of the printed circuit board as electrically connected to the electrically conductive paths, and electrical conductors disposed at the second side of the printed circuit An representative embodiment according to the inventive concept is directed to a mobile computing device, including a printed circuit board (PCB) having a first side and an opposing second side, a first IC attached to the first side, and a power management IC (PMIC) die attached to the second side and an opposite side to the first IC, and in which the PCB includes electrical paths which connect the first IC and the PMIC. The mobile computing device further includes pads on the second side and which are electrically connected to the electrical paths. The pads are arrayed so that they can be used not only as test pads which transfer test signals for testing the first IC but also as connection pads for attaching the PMIC to the PCB. These elements constitute a system on package (SoP) of the mobile computing device. The mobile computing device may also have a display and an interface operatively connecting the display to the SoP.

BRIEF DESCRIPTION OF THE DRAWINGS

These and/or other aspects and advantages of the present general inventive concept will become more readily apparent and appreciated from the following detailed description of embodiments, taken in conjunction with the accompanying drawings of which:

FIGS. 4A, 4B and 4C are elevation views of examples of still another exemplary embodiment of an SoP module according to the inventive concept;

FIG. 5 is an elevation view still another representative embodiment of an SoP module according to the inventive concept;

DETAILED DESCRIPTION OF THE PREFERRED EMBODIMENTS

Figure 1:
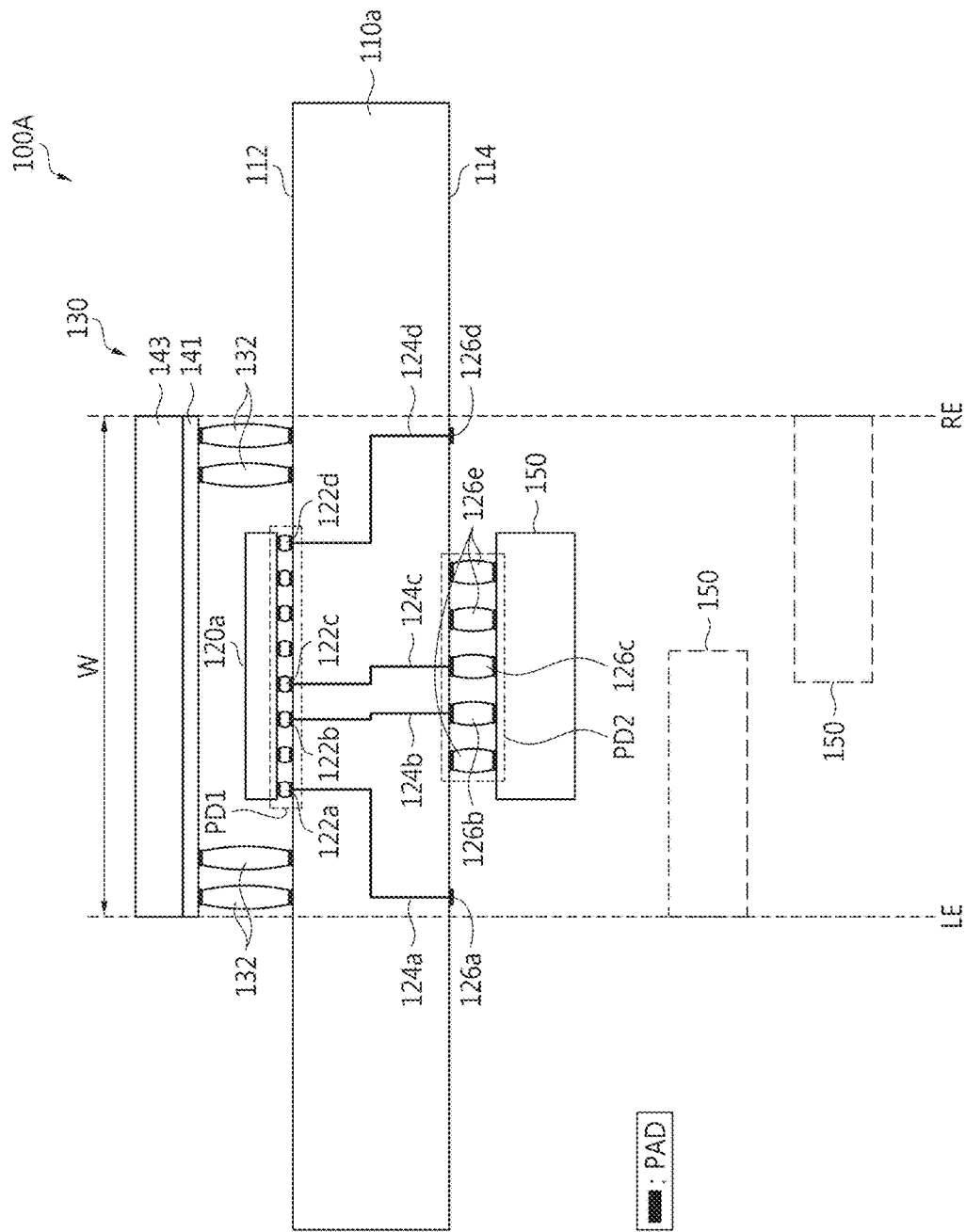
FIG. 1 is an elevation view of a first representative embodiment of a system on package (SoP) module according to the inventive concept.

The present inventive concepts now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. The drawings are also schematic in nature. Like numbers designate like elements throughout the drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein. In these respects, for example, the term "IC" will be understood as referring to any component, namely, a "chip", comprising circuitry on a substrate (die) regardless of whether the circuitry and substrate (die) are packaged and may at times, as the context makes clear, refer to a component that is purely an IC. The term "active electronic component" will be understood, in general, as referring to any device having a component or array of components that requires power to operate, such as a memory device, data processing device, or micro-electronic machine (MEMs). Thus, the term "active electronic component" includes ICs regardless of whether they include additional elements such as packaging, and micro-mechanical elements (color filters, micro-lenses, for example, in the case of an image sensor). On the other hand, the term "passive electronic component" will refer to passive elements that do not require a source of energy to perform their function, such as capacitors, resistors and inductors, and are referred to in places merely as passive elements.

Figure 2:
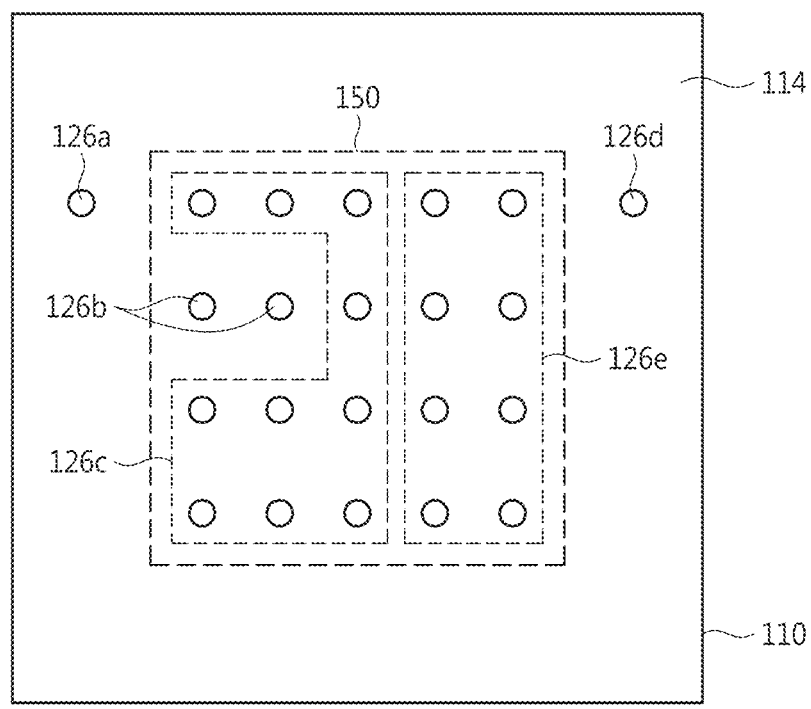
FIG. 2 schematically shows the bottom or second side of a printed circuit board (PCB) of an example of the first embodiment of an SoP module according to the inventive concept.

FIGS. 1 and 2 schematically illustrate representative embodiments of a system on package (SoP) module according to the inventive concept.

Referring to FIG. 1, the system on package (SoP) module 100A includes a printed circuit board (PCB) 100*a* and a plurality of electronic components disposed on the printed circuit board (PCB) 100*a*. The SoP module 100A may be a system-level assembly or board-level assembly.

The PCB 110*a* may be a mainboard. The PCB 110*a* has a first side 112 and an opposing second side 114. Various electronic components, on a chip scale, are disposed on the first side 112 and the second side 114 of the PCB 110*a*. The components may be active electronic components (e.g., those comprising ICs), and passive electronic components (e.g., resistors, capacitors and/or inductors). The ICs may be in the form of a bare IC or a packaged IC. The IC packaging may be any known type of packaging such as surface mount technology (i.e., the IC package may have a chip carrier), area array packaging technology, etc. The passive electronic components may also be in packaged chip form.

In the illustrated embodiment of FIG. 1, a first IC 120*a* and a memory package 130 are mounted on and attached to the first side 112 of the PCB 110*a*, and a second IC 150 is mounted on and attached to the second side 114 of the PCB 110*a*.

In one example of this embodiment, of the remainder of active and passive electronic components that further constitute an SoP, only active electronic components (e.g., those comprising ICs) are further mounted to the second side 114 of the PCB 110*a* (to which the second IC 150 is attached), and only passive electronic components are attached to the first side 112 (to which first IC 120*a* and memory package 130 are attached). In another example of this embodiment, of the remainder of active and passive electronic components that further constitute an SoP, active electronic components (e.g., those comprising ICs) and passive electronic components (including, for example, passive electronic components contributing to an operation of the second IC 150) are attached to the second side 114 of the PCB 110*a* (to which the second IC 150 is attached, and passive electronic components are attached to the first side 112 of the PCB 110*a* (to which the first IC 120*a* and the memory package 130 are attached). According to yet another example of this embodiment, of the remainder of active and passive electronic components that further constitute an SoP, active electronic components (e.g., those comprising ICs) and passive electronic components (including, for example, passive electronic components contributing to an operation of the second IC 150) are attached to the second side 114 of the PCB 110a (to which the second IC 150 is attached), and active electronic components and passive electronic components are also attached to the first side 112 of the PCB 110a (to which the first IC 120a and the memory package 130 are attached).

The PCB 110a also comprises electrically conductive paths along which at least one electronic component mounted on and attached to the first side 112 of the PCB 110a and at least one electronic component mounted on and attached to the second side 114 of the PCB 110a are electrically connected. For example, operating voltages (power and/or ground) and signals are transmitted along the conductive paths. To this end, the PCB 110a may include one or more dielectric material (insulating) layers, a plurality of metal (wiring) layers separated from each other by the dielectric material (insulating) layer(s), and conductive vias extending through the dielectric material layer(s) and electrically connecting the metal (wiring) layers to each other. Each electrical path may consist of a via, i.e., a through-via or may consist of a plurality of vias and at least one inner metal wiring layer of the PCB 110a.

Note, in the figures illustrating some of the embodiments that follow the conductive paths may be omitted for the sake of clarity.

Furthermore, the first IC 120a may be attached to the first side 112 of the PCB 110a by first interconnects PD1. The first interconnects PD1 may comprise electrically conductive material. For example, each of the first interconnects PD1 may comprise at least one of a conductive pad or land of conductive material such as copper, a pin, and a solder bump (ball or the like of solder). In the example shown in FIG. 1, each of the interconnects PD1 includes a solder bump, and conductive pads connected to upper and lower portions of the solder bump, respectively. However, the interconnects PD1 are not limited to being formed of such elements. In other examples, the first IC 120a has the structure of a flip chip or is otherwise mounted to the first side 112 in the manner of a flip chip, and the first interconnects PD1 are flip-chip bumps. That is, the first IC 120a may be directly connected to the PCB 110a at the first side 112 thereof by flip-chip bumps at an active surface of the first IC 120a.

The first IC 120a may comprise a microprocessor (single core or multi-core), a graphics processor, a signal processor, a network processor, a chip set, an audio codec, an application processor, or a system on chip (SoC), but is not limited to any of such active electronic components.

The second IC 150 may be attached to the second side 114 of the PCB 110a through second interconnects PD2. The second interconnects PD2 may comprise electrically conductive material. For example, each of the second interconnects PD2 may comprise at least one of a conductive pad or land of conductive material such as copper, a pin, and a solder bump (ball or the like of solder). In the example shown in FIG. 1, each of the interconnects PD2 includes a solder bump, and conductive pads connected to upper and lower portions of the solder bump, respectively.

The electrically conductive paths of the PCB 110a which electrically connect the first IC 120a and the second IC 150 may include first electrical paths 124b and 124c (along which different types of signals/voltages are transmitted, respectively). In particular, the first IC 120a and the second IC 150 may be electrically connected through the first electrical paths 124b and 124c and respective conductors, e.g., (solder) bumps 122b, 122c, 126b, and 126c of the first interconnects PD1 and second interconnects PD2. Hereinafter, these conductors will be referred to as bumps but they may alternatively be conductive pads of the first interconnects PD1 and second interconnects PD2.

The bumps 122b and 126b are electrically connected to the first electrical path 124b, and the bumps 122c and 126c are electrically connected to the first electrical path 124c. Furthermore, the bumps 126b, 126c of the second interconnects PD2 can be used as test bumps which transfer test signals for testing the first IC 120a before the PMIC 150 is attached to the second interconnects PD2, as well as attachment bumps for attaching the PMIC 150 to the PCB 110a.

The second interconnects PD2 also may include second conductors, e.g., (solder) bumps 126e or pads, which are not connected to any of the electrical paths of the PCB 110a used to electrically connect the first and second ICs 120a, 150. In this case, the second bumps 126e (or pads) may be used as the attachment bumps (or pads) for attaching the PMIC 150 to the PCB 110a.

The second IC 150 may be a power management IC (PMIC) 150; however, it is not limited thereto. Also, the PMIC 150 may be disposed on the second side 114 of the PCB 110a within the projection of the width W (or footprint) of the memory package 130. For example, according to a design specification, the PMIC 150 may be attached to the second side 114 of the PCB 110a between a first edge LE and a second edge RE of the memory package 130 as viewed in plan. Thus, in this case, the PMIC 150 is completely overlapped by the memory package 130.

The SoP module 100A may also include at least one "test only" pads 126a and 126d attached to (or forming part of) the second side 114 of the PCB 110a outside the specified mounting area of the PMIC 150. The test only pads 126a and 126d are electrically connected to the first IC 120a through electrical paths 124a and 124d, and (solder) bumps 122a and 122d of the first interconnections PD1, respectively. When the PMIC 150 is attached to the second side 114 of the PCB 110a through the second interconnects PD2, the first IC 120a cannot be tested using bumps, namely, bumps 126b and 126c, (or pads) of the second interconnects PD2. Accordingly, the first IC 120a may be tested using at least one "test only" pad 126a and 126d.

FIG. 2 shows an example of a layout of the second interconnects PD2 (test and electrical connection/attachment conductors comprising solder bumps 126b, 126c, for example, and attachment only conductors comprising solder bumps 126e, for example) in the case in which the module also includes at least one "test only" pad 126a and 126d.

The memory package 130 may be attached to the first side 112 of the PCB 110a through third interconnects 132. The memory package 130 may lie over the first IC 120a. The memory package 130 may include a substrate (for example, a package substrate 141) including an upper side and a lower side, and one or more ICs 143 disposed at the upper side of the substrate 141. The ICs 143 may include stacked memory ICs. In this case, the stacked memory ICs may consist of the same type of memory ICs or may include different types of memory ICs.

The memory package 130 may comprise a volatile memory and/or a non-volatile memory. Examples of the volatile memory include a dynamic random access memory (DRAM), a static random access memory (SRAM), a thyristor RAM (T-RAM), a zero capacitor RAM (Z-RAM), and a Twin Transistor RAM (TTRAM). Examples of the non-volatile memory include an electrically erasable programmable read-only memory (EEPROM), a flash memory, a magnetic RAM (MRAM), a spin-transfer torque MRAM (STT-MRAM), a ferroelectric RAM (FRAM), a phase change RAM (PRAM), a resistive RAM (RRAM), a nanotube RRAM, a polymer RAM (PoRAM), a nano floating gate memory (NFGM), a holographic memory, a molecular electronics memory device, and an insulator resistance change memory.

In examples of this embodiment, the memory package 130 includes any one of a number of different types of memory ICs, e.g., a DRAM, a NAND flash memory including a controller, a NOR flash memory, a ferroelectric RAM (FRAM), a phase change RAM (PRAM), or a magnetic RAM (MRAM), and passive electronic elements.

Figure 3:
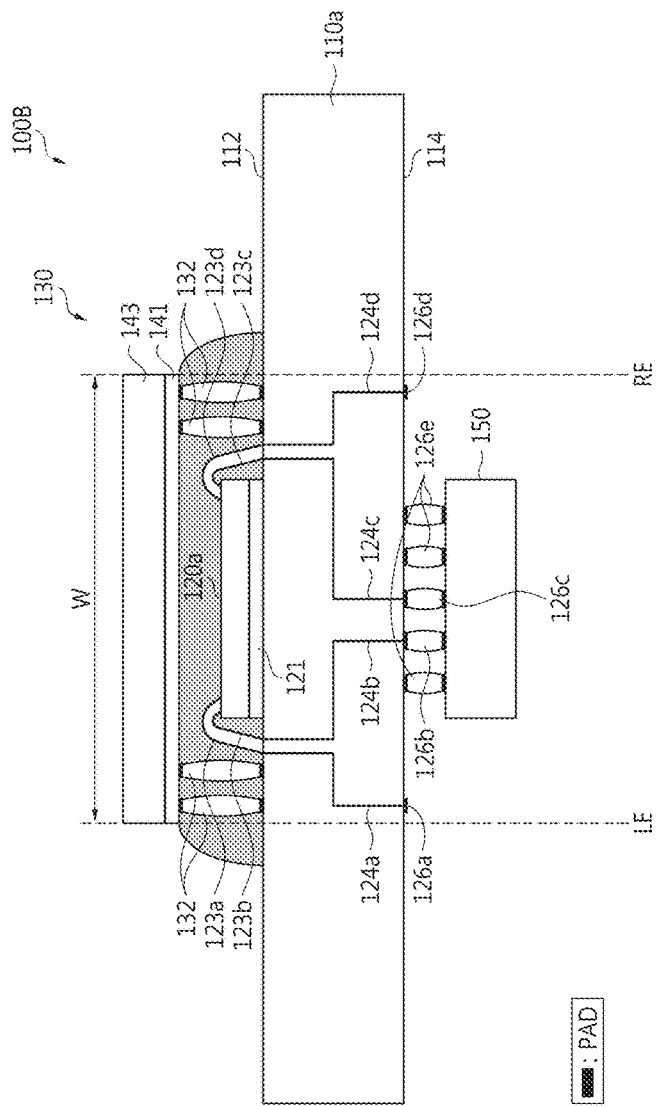
FIG. 3 is an elevation view of another representative embodiment an SoP module according to according to the inventive concept.

FIG. 3 schematically shows another representative embodiment of an SoP module according to the inventive concept.

In this embodiment, the first IC 120a is attached to the first side 112 of the PCB 110a through an adhesive layer 121. Bonding wires 123a to 123d electrically connected to the first IC 120a are connected to the electrical paths 124a to 124d.

The first IC 120a, the bonding wires 123a to 123d, and the third interconnects 132 may be protected by an underfill material and/or an encapsulation material.

Figure 4A:
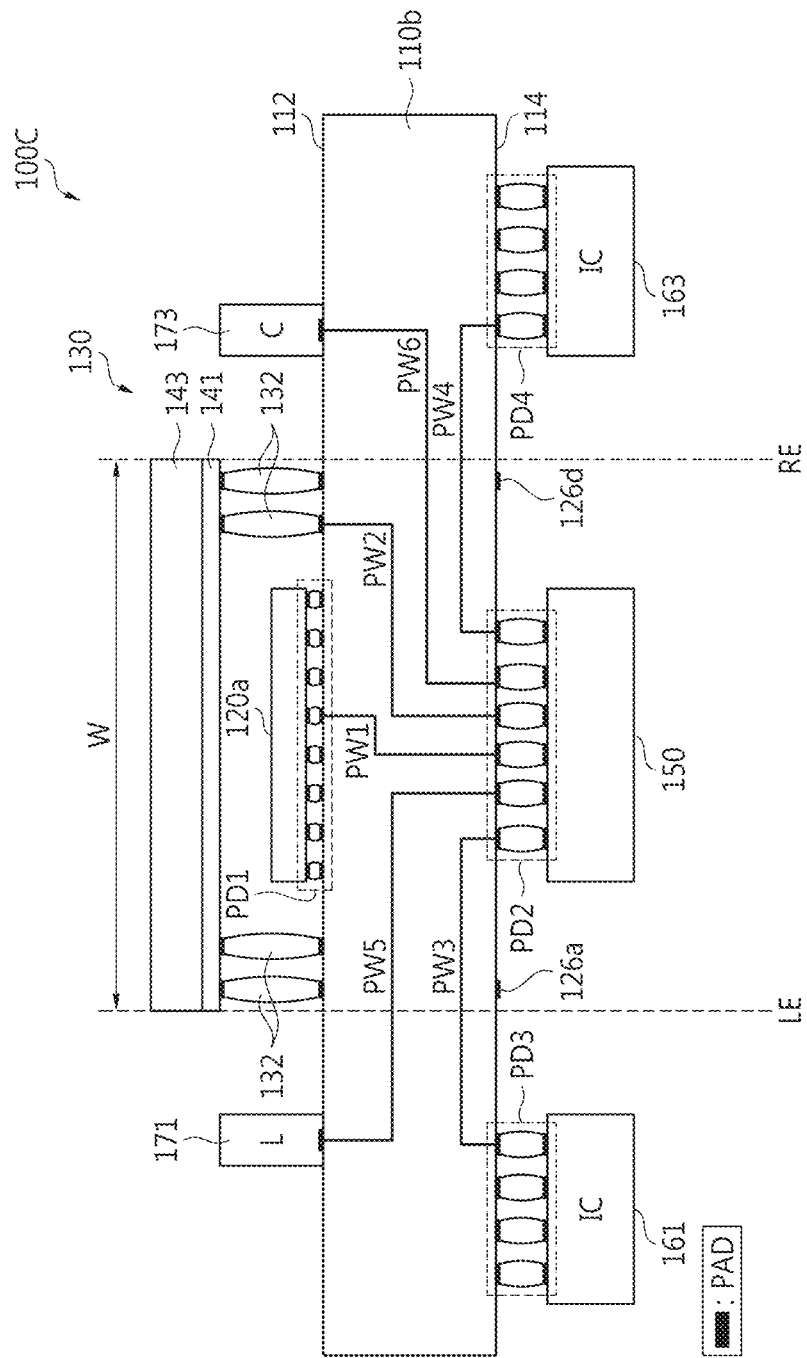
Figure 4B:
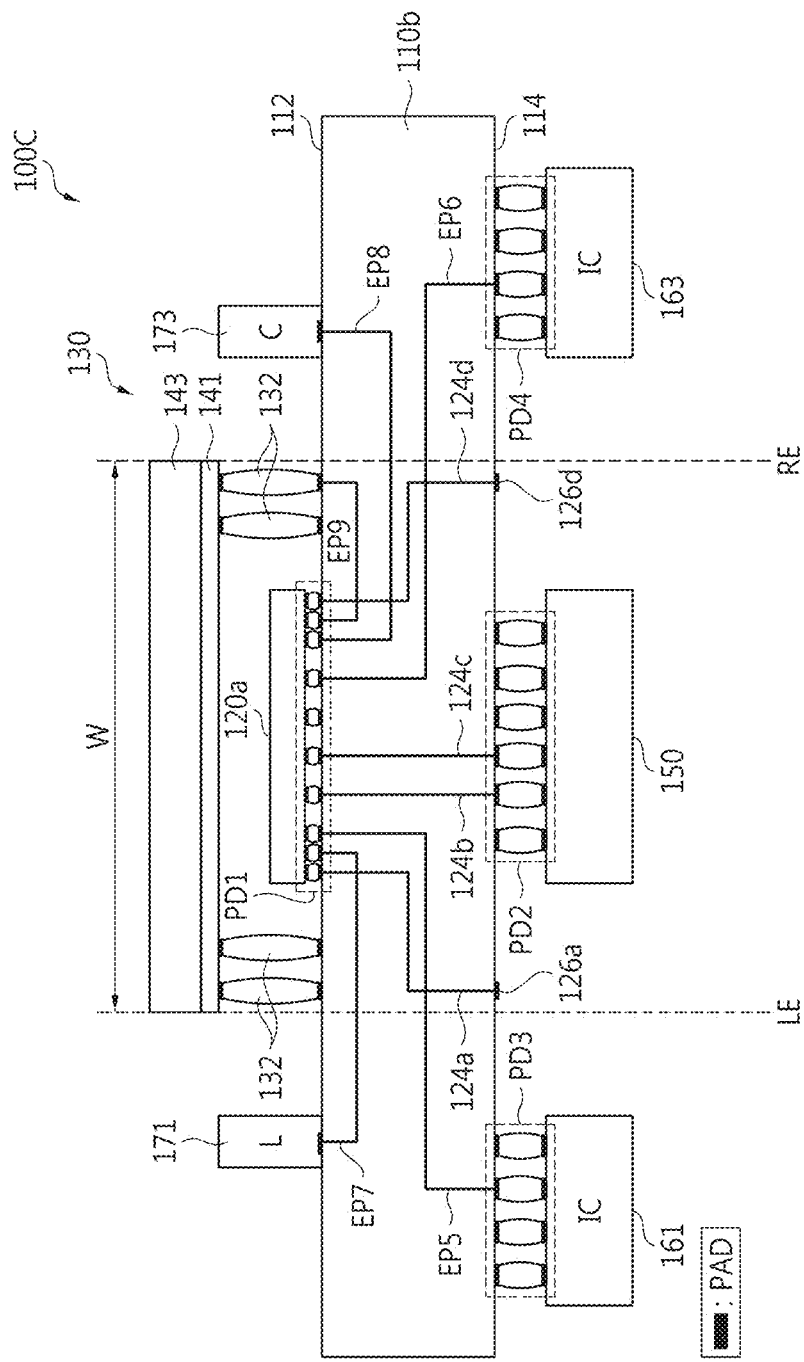

FIGS. 4A to 4C schematically show other exemplary embodiments of an SoP module according to the present inventive concept. In the exemplary embodiments shown in FIGS. 4A to 4C, the first IC 120a is attached to the PCB 110b in a flip-chip manner. Alternatively, however, the IC 120a can be connected to the PCB 110b through bonding wires.

Referring to FIG. 4A, all ICs 161 and 163 of SoP module 100C, except for the first IC 120a and the memory package 130, are attached to the second side 114 of the PCB 100b. Accordingly, no passive elements (for example, resistor, capacitor, and/or inductor) are attached to the second side 114.

The IC 161 may be connected to the PCB 110b through fourth interconnects PD3, and the IC 163 may be connected to the PCB 110b through fifth interconnects PD4. Each of passive elements 171 and 173 may be connected to the PCB 110b through a pad.

More specifically, the SoP module 100C may include a first IC 120a attached to the first side 112 of the PCB 100b through the first interconnects PD1, a memory package 130 attached to the first side 112 through the third interconnects 132, and a plurality of passive elements 171 and 173 attached to the first side 112 through pads. The passive element 171 may be embodied as one of a resistor, a capacitor, and an inductor (for example, an inductor L), and the passive element 173 may be another of the resistor, the capacitor, and the inductor (for example, a capacitor C).

The inductor L may be connected to a low drop out (LDO) regulator, and the capacitor C may be connected to a DC-DC converter or a buck converter. For example, a signal line connected to the resistor may be a signal line for termination.

For convenience of description in FIG. 4A, two passive elements 171 and 173 are shown attached to the first side 112 and two additional ICs 161 and 163 are shown attached to the second side 114. However, such an embodiment according to the present inventive concept is not limited by the number of passive elements attached to (or disposed on) the first side 112 of the PCB 110b and/or the number of ICs attached to (or disposed on) the second side 114 of the PCB 110b.

Still referring to FIG. 4A, power PW1, PW2, PW3, PW4, PW5, and PW6 output from the PMIC 150 may be supplied to the components 120a, 143, 161, 163, 171, and 173, respectively. Also, each power output PW1, PW2, PW3, PW4, PW5 and PW6 may include a corresponding operation voltage and a ground voltage. Although only power outputs PW1, PW2, PW3, PW4, PW5 and PW6 are illustrated in FIG. 4A, the PCB 110b may include electrically conductive paths (which are the same as or similar to paths 124a, 124b, 124c and 124d) which electrically connect the first IC 120a and the second IC 150. The PCB 110b may also include electrically conductive paths which electrically connect each of the components 120a, 150, 161, 163, 171 and 173. For example, each of components 120a, 150, 161, 163, 171 and 173 may transmit or receive signals each other through corresponding electrically conductive paths of the PCB 110b. The layout or routing of the electrically conductive paths may be variously modified in different embodiments of the present inventive concepts.

Referring to FIG. 4B, the first IC 120a and an IC 161 may be connected to each other through an electrical path EP5, the first IC 120a and an IC 163 may be connected to each other through an electrical path EP6, the first IC 120a and the passive element 171 may be connected to each other through an electrical path EP7, the first IC 120a and the passive element 173 may be connected to each other through an electrical path EP8, and the first IC 120a and the memory package 130 may be connected to each other through an electrical path EP9. Signals (or data) may be transferred through each of the electrical paths EP5 to EP9. Also, each of the electrical paths EP5 to EP9 may include one or more signal lines. Although electrical paths EP5 to EP9 and electrical paths 124a, 124b, 124c and 124d are illustrated in FIG. 4B, the PCB 110b may include electrically conductive paths which electrically connect each of the components 120a, 150, 161, 163, 171 and 173 and the PCB 110b may include power lines supplying each power to each of the components 120a, 161, 163, 171 and 173. For example, each of the components 120a, 150, 161, 163, 171 and 173 may communicate each other through corresponding electrically conductive paths of the PCB 110b. The layout or routing of the electrically conductive paths may be variously modified in different embodiments of the present inventive concepts.

Referring to FIG. 4C, the PMIC 150 may include at least one device or circuit 151. The at least one device 151 may include an audio codec, a wired charger, a wireless charger, a battery fuel gage, an analog-digital converter (or global purpose analog-to-digital converter (GP ADC), a flash LED driver, a backlight LED driver, an RGB LED driver, a temperature compensated crystal oscillator (TCXO) buffer, a real time clock (RTC) oscillator, a back-up battery charger, and/or a subscriber identification module (SIM)/smart card level translator. The at least one device 151 may be connected to each of the components 120a, 130, 161, 163, 171, and 173 through the electrical paths of the PCB 110b. Although the electrical paths of the PCB 110b which electrically connect the at least one device 151 and the each of the components 120a, 130, 161, 163, 171, and 173. The PCB 110b may include electrically conductive paths which electrically connect each of the components 120a, 150, 161, 163, 171 and 173. For example, each of the components 120a, 150, 161, 163, 171 and 173 may communicate each other through corresponding electrically conductive paths of the PCB 110b. The layout or routing of the electrically conductive paths may be variously modified in different embodiments of the present inventive concepts FIG. 5 schematically shows still another representative embodiment of an SoP module according to the inventive concept.

In the illustrated example of this embodiment, ICs 150, 161, and 163 and passive elements 172-1 and 172-2 are attached to the second side 114 of the PCB 110C, and the first IC 120a, the memory package 130, and passive elements 171, 171-1, 173, and 173-1 are attached to the first side 112 of the PCB 100c. The passive elements 172-1 and 172-2 may be necessary for an operation of the PMIC 150, an operation of the first die 120a, or an operation of the memory package 130. Although only electrical paths 124a, 124b, 124c and 124d of the PCB 110c are illustrated in FIG. 5, the PCB 110c may include electrically conductive paths which electrically connect each of the components 120a, 150, 161, 163, 171, 171-1, 172-1, 172-2, 173 and 173-1 and the PCB 110c may include power lines supplying each power to each of the components 120a, 161, 163, 171, 171-1, 172-1, 172-2, 173 and 173-1. For example, each of the components 120a, 150, 161, 163, 171, 171-1, 172-1, 172-2, 173 and 173-1 may communicate each other through corresponding electrically conductive paths of the PCB 110c. The layout or routing of the electrically conductive paths may be variously modified in different embodiments of the present inventive concepts.

Figure 6A:
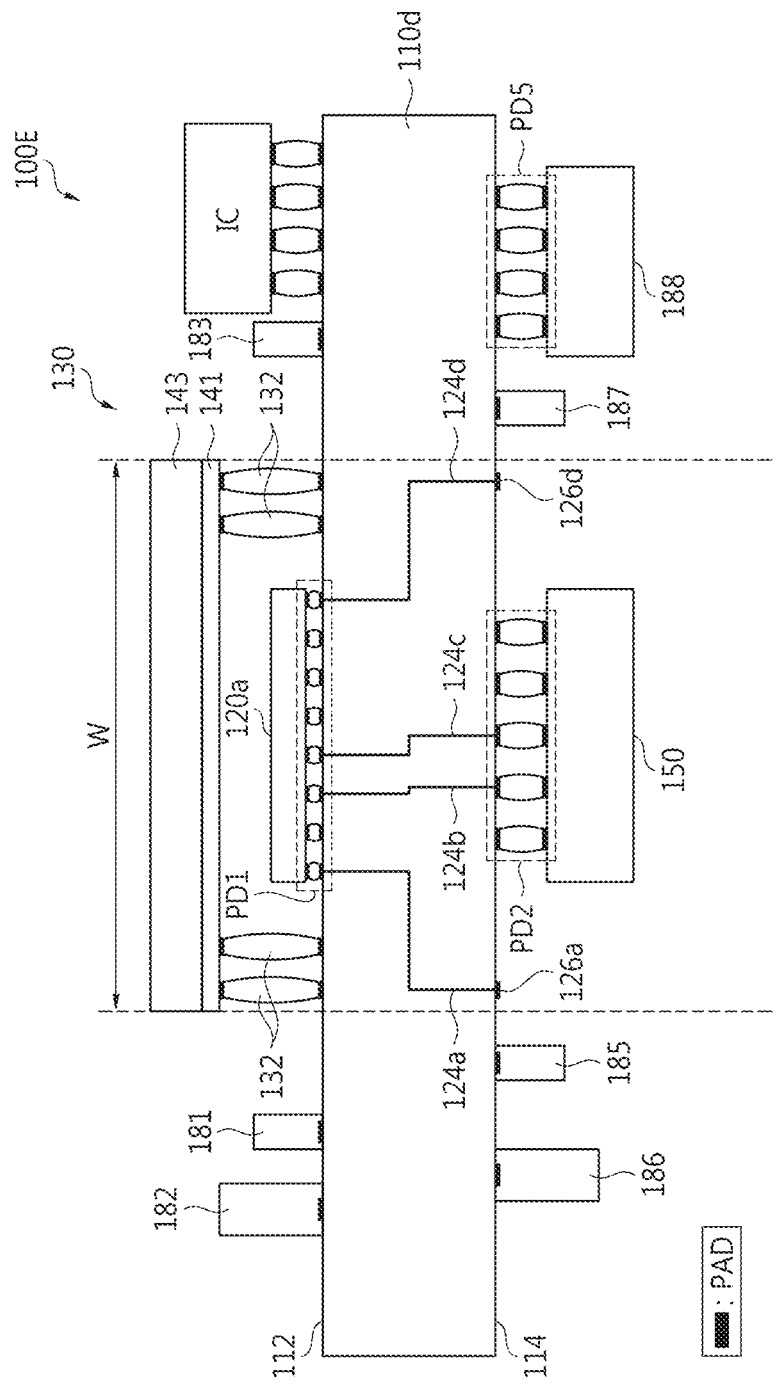
FIGS. 6A, 6B and 6C are elevation views of examples of still another exemplary embodiment of an SoP module according to the inventive concept.

FIG. 6A schematically shows still another representative embodiment of an SoP module according to the inventive concept.

In the illustrated example of this embodiment, ICs 150 and 188 and passive elements 185, 186, and 187 are attached to the second side 114 of the PCB 110d. The first IC 120a, the memory package 130, at least one IC, and passive elements 181, 182, and 183 are attached to the first side 112 of the PCB 110d.

The IC 188 may be attached to the PCB 110d through sixth interconnects PD5, and the structure of the sixth interconnects PD5 is similar to the structure of the first interconnects PD1.

A component 181 which is disposed on the first side 112 and is operatively electrically connected to the first IC 120a and/or the PMIC 150 is disposed between the memory package 130 and the passive element 182 disposed closest to the memory package 130. The component 181 may comprise a passive element (for example, resistor, capacitor, or inductor) necessary for an operation of at least one of the first die 120a and/or the PMIC 150.

A component 183 which is disposed on the first side 112 and is operatively electrically connected to the first IC 120a and/or the PMIC 150 is disposed between the memory package 130 and the IC closest to the memory package. The component 183 may comprise a passive element (e.g., resistor, capacitor, and inductor) necessary for an operation of at least one of the first die 120a and/or the PMIC 150. A component 185 which is disposed on the second side 114 and is operatively electrically connected to the first die 120a and/or the PMIC 150 may be disposed between the PMIC 150 and the passive element 186 closest to the PMIC 150.

A component 187 which is disposed on the second side 114 and is operatively connected to the first IC 120a and/or the PMIC 150 is disposed between the PMIC 150 and the IC 188 closest to the PMIC 150. Each of the components 185 and 187 may comprise a passive element (e.g., resistor, capacitor, or inductor) necessary for an operation of at least one of the first die 120a and/or the PMIC 150.

Figure 6B:
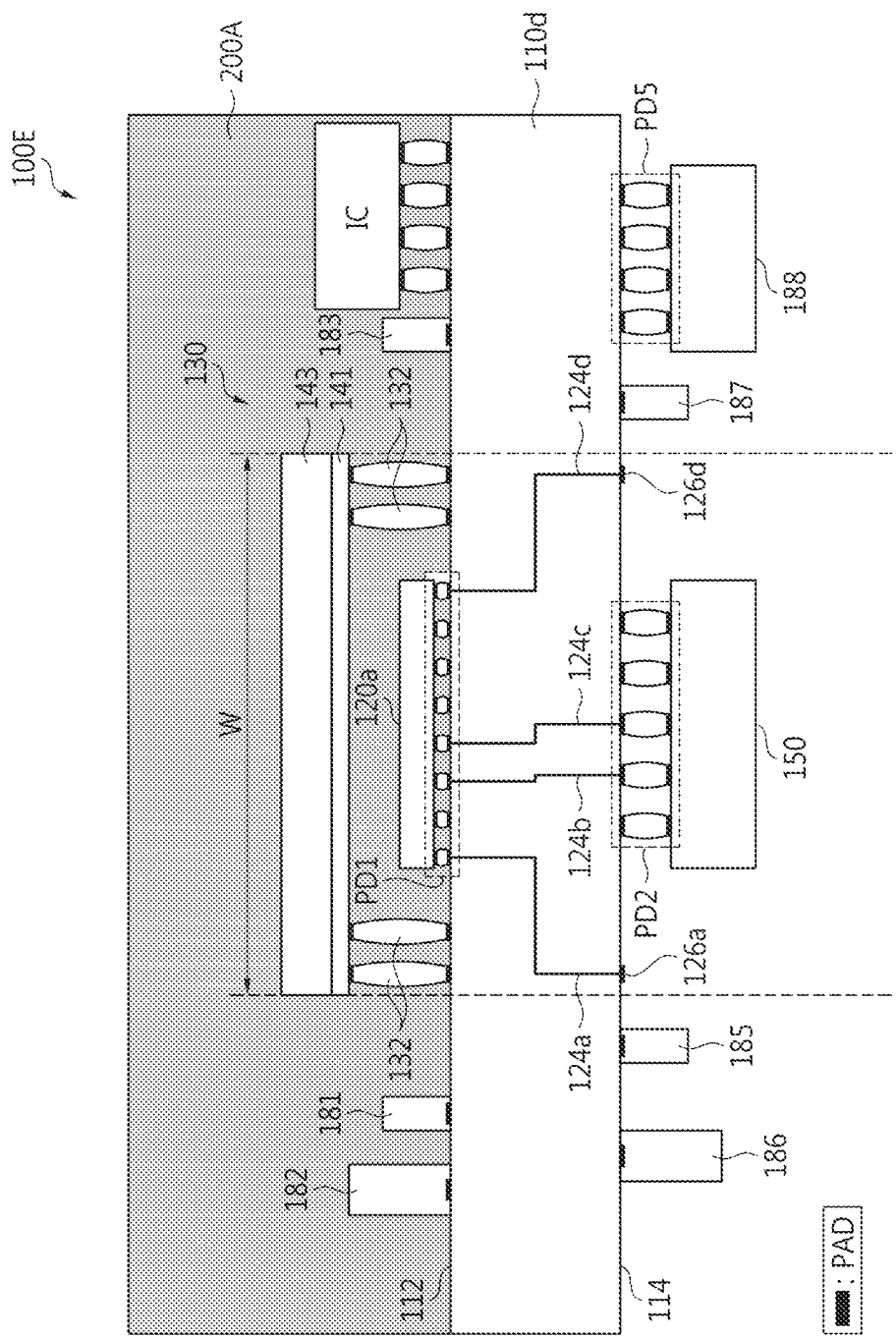

FIG. 6B schematically shows still another representative embodiment of an SoP module according to the inventive concept. Referring to FIG. 6B, an SoP module 100E includes a first epoxy molding compound (EMC) mold 200A. The first EMC mold 200A may protect not only the first IC 120a and the memory package 130 attached to the first side 112 but also other components 132, 181, 182, 183, and ICs.

Moreover, because the first EMC mold 200A is provided in the SoP module 100E, markings on surface-mount devices (SMD) may remain stable. Such markings may be information on a manufacturer of the SoP module 100E, product information of the SoP module 100E, and/or alignment marks for a pattern recognition system (PRS).

For electromagnetic shielding and/or electromagnetic interference (EMI) shielding, the first EMC mold 200A may be coated with a shielding material or comprise the shielding material. For example, the first EMC mold 200A may be coated with a ferrite material. Physical vapor deposition (PVD), sputtering, or thermal spraying may be used to form such a coating. Alternatively, the mold 200A may comprise a ferrite filter material.

Figure 6C:
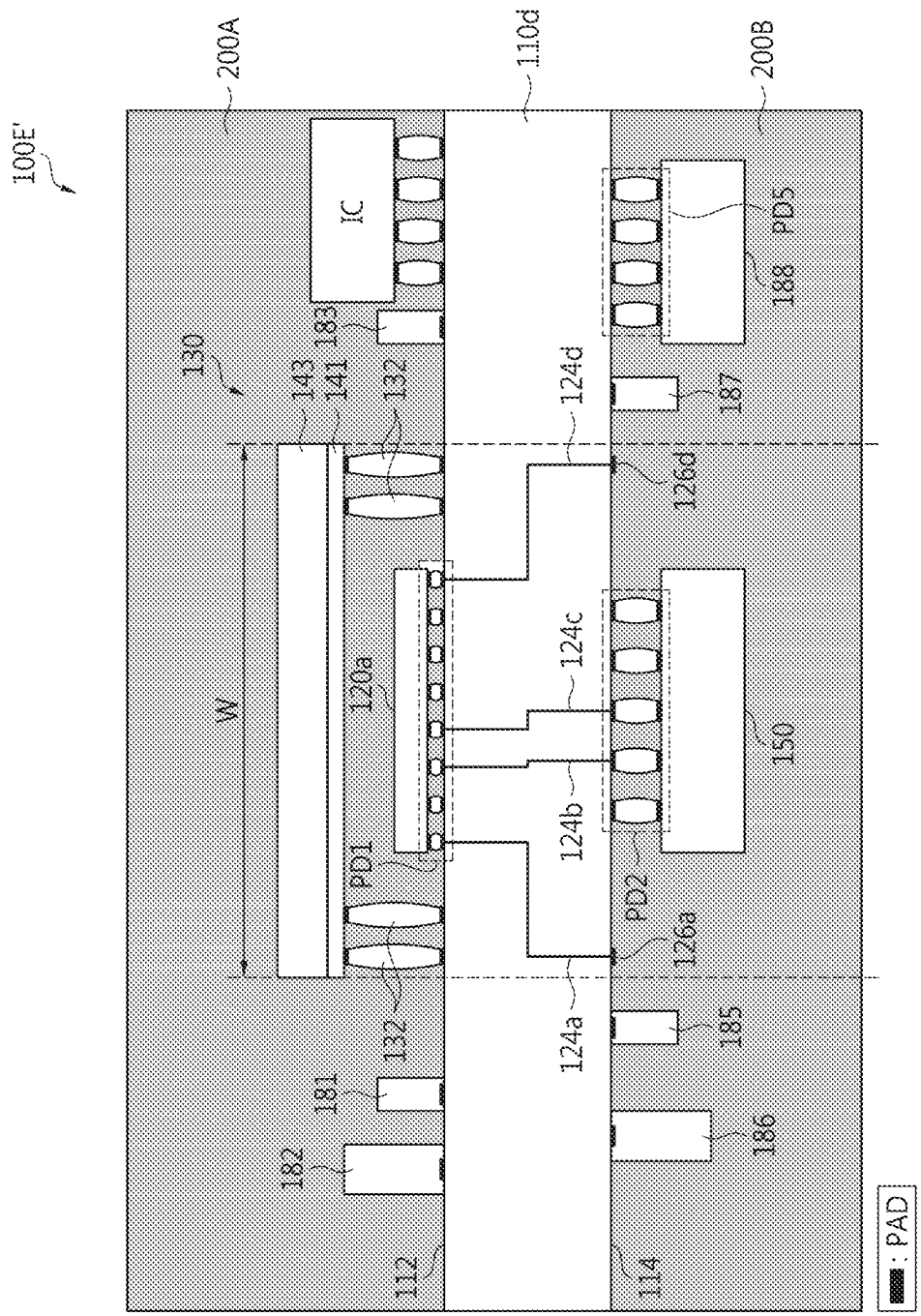

FIG. 6C schematically shows still another representative embodiment of an SOP module according to the inventive concept.

Referring to FIG. 6C, SoP module 100E' also includes a second EMC mold 200B. The second EMC mold 200B may protect not only the second IC 150 attached to the second side 114 but also other components 185 to 188.

A structure and a function of the first EMC mold 200A may be similar to those of the second EMC mold 200B. Except for the second EMC mold 200B, the SoP module 100E' of FIG. 6C is similar to the SoP module 100E of FIG. 6B. Although only electrical paths 124a, 124b, 124c and 124d of the PCB 110d are illustrated in 6A, 6B or 6C, the PCB 110d may include electrically conductive paths which electrically connect each of the components 120a, 150, 181, 182, 183, 185, 186, 187, 188 and at least one IC, and the PCB 110d may include power lines supplying each power to each of the components 120a, 181, 182, 183, 185, 186, 187, 188 and at least one IC. For example, each of the components 120a, 150, 181, 182, 183, 185, 186, 187, 188 and at least one IC may communicate each other through corresponding electrically conductive paths of the PCB 110d. The layout or routing of the electrically conductive paths may be variously modified in different embodiments of the present inventive concepts.

Figure 7A:
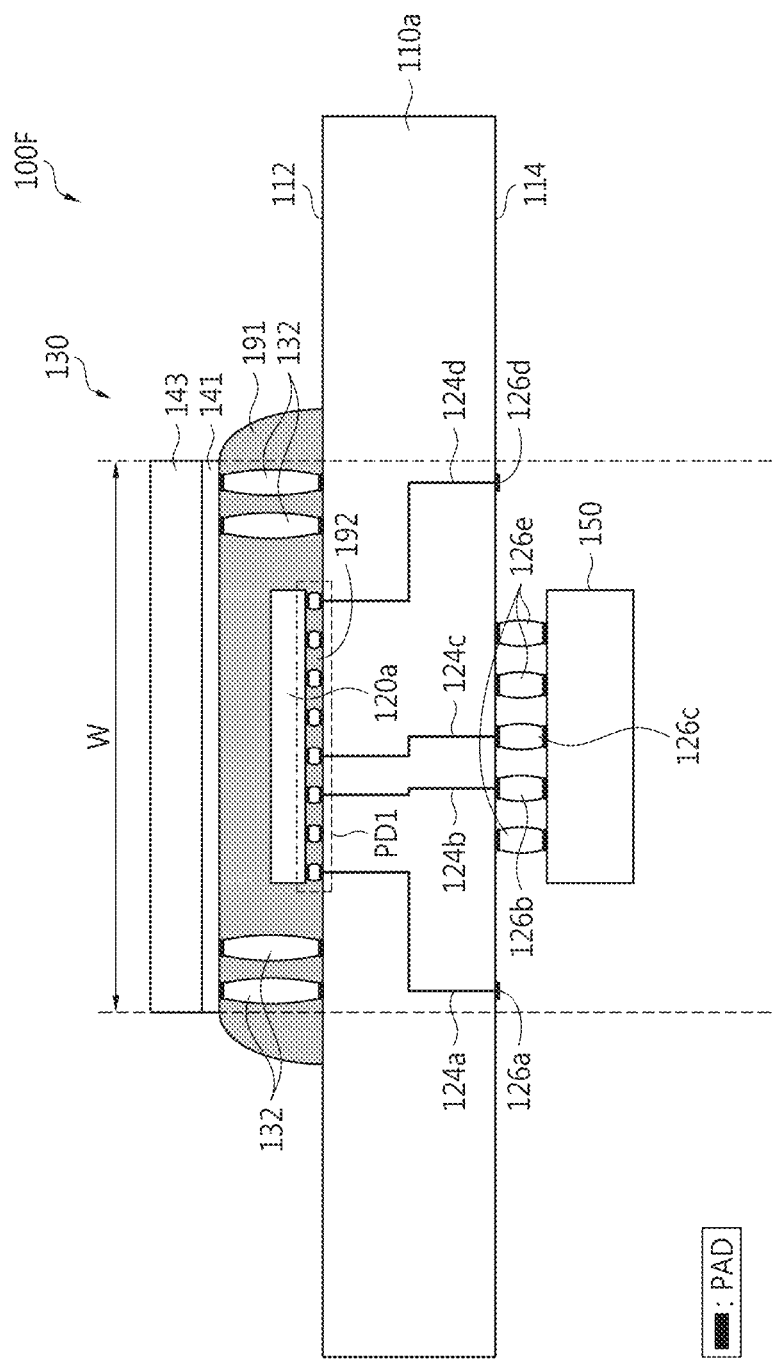
FIGS. 7A, 7B and 7C are elevation views of examples of still another exemplary embodiment of an SoP module according to the inventive concept.

FIG. 7A schematically shows still another representative embodiment of an SoP module according to the inventive concept.

Referring to FIGS. 1 and 7A, SoP module 100F may includes a first underfill material 191 filling the space between the first IC 120a and the memory package 130. The underfill material 191 may be an EMC mold but is not limited thereto.

As shown in FIG. 7A, the first underfill material 191 may extend to laterally outwardly of the memory package 130. Accordingly, when viewed from atop the memory package 130, the first underfill material 191 is visible. As shown in FIG. 7A, the space between the first side 112 of the PCB 110a and the first IC 120a may be filled with a second underfill material 192. The first underfill material 191 and the second underfill material 192 may be the same material or different materials. In another example of this embodiment, only the second underfill material 192 is provided in the SoP module 100F. That is, the first underfill material 191 is optional.

Figure 7B:
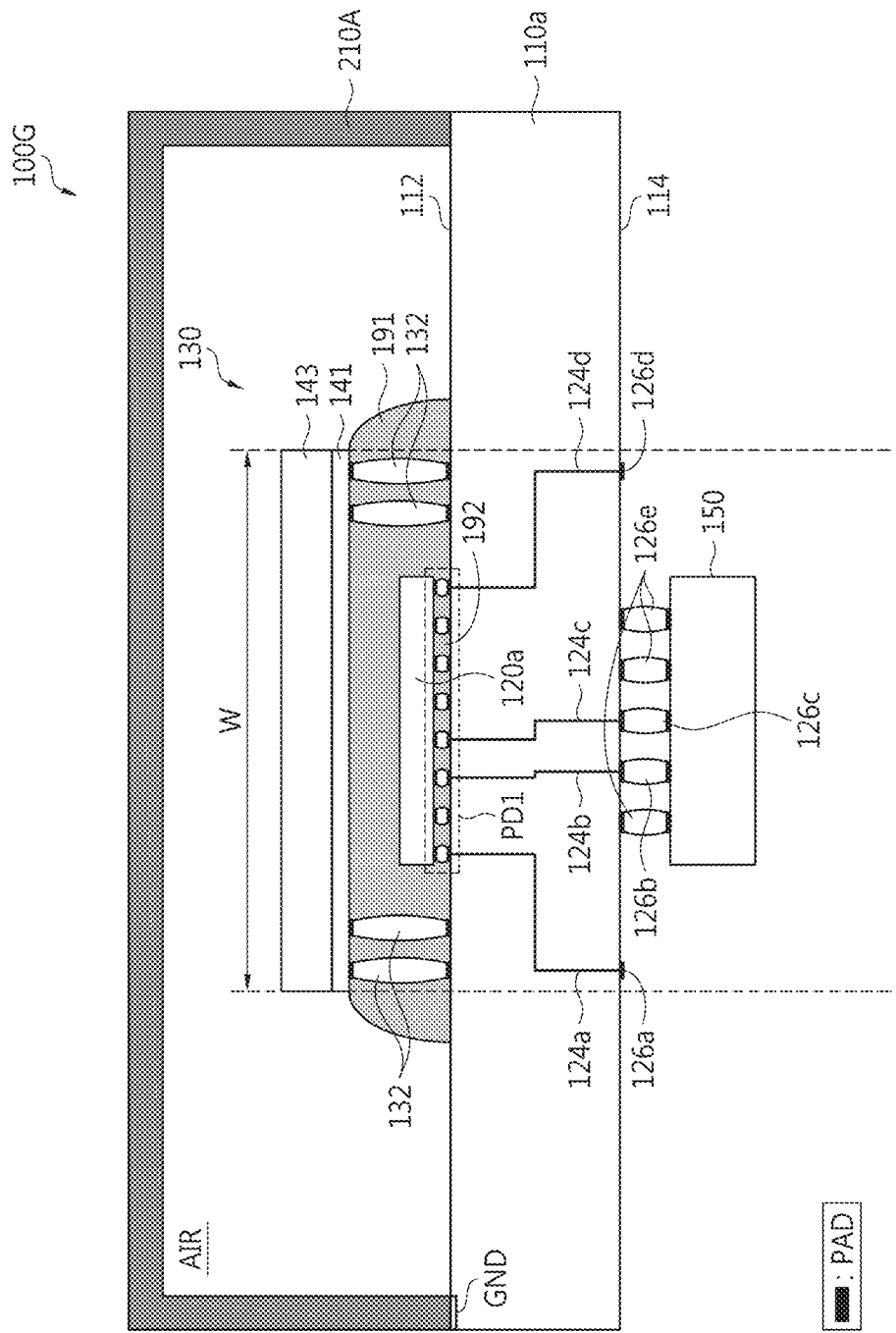

FIG. 7B schematically shows still another representative embodiment of an SoP module according to the inventive concept.

Referring to FIG. 7B, SoP module 100G includes a first metal shielding material 210A. The first metal shielding material 210A may protect not only the first IC 120a and the memory package 130 attached to the first side 112 but also other components 132, 181, 182, 183, and ICs. That is, the first metal shielding material 210A may surround not only the first IC 120a and the memory package 130 attached to the first side 112 but also other components 132, 181, 182, 183, and ICs.

The first metal shielding material 210A may be connected to a ground line GND of the PCB 100a. For example, the first metal shielding material 210A and the ground line GND may be connected to each other through solder, a nonconductive paste (NCP), or material such as a nonconductive film (NCF) but it is not limited to being formed of any of these materials.

The first metal shielding material 210A may perform an electromagnetic shielding function and/or an EMI shielding function in the SoP module 100G. Accordingly, an electromagnetic shielding function and/or an EMI shielding of not only the first IC 120a and the memory package 130 attached to the first side 112 but also other components 132, 181, 182, 183, and ICs may be improved. Moreover, the first metal shielding material 210A may ensure the stability of markings on a surface-mount device (SMD). The space between the first side 112 of the PCB 100a and the first metal shielding material 210A may be left empty (i.e., may be air space) but the embodiment is not so limited.

Figure 7C:
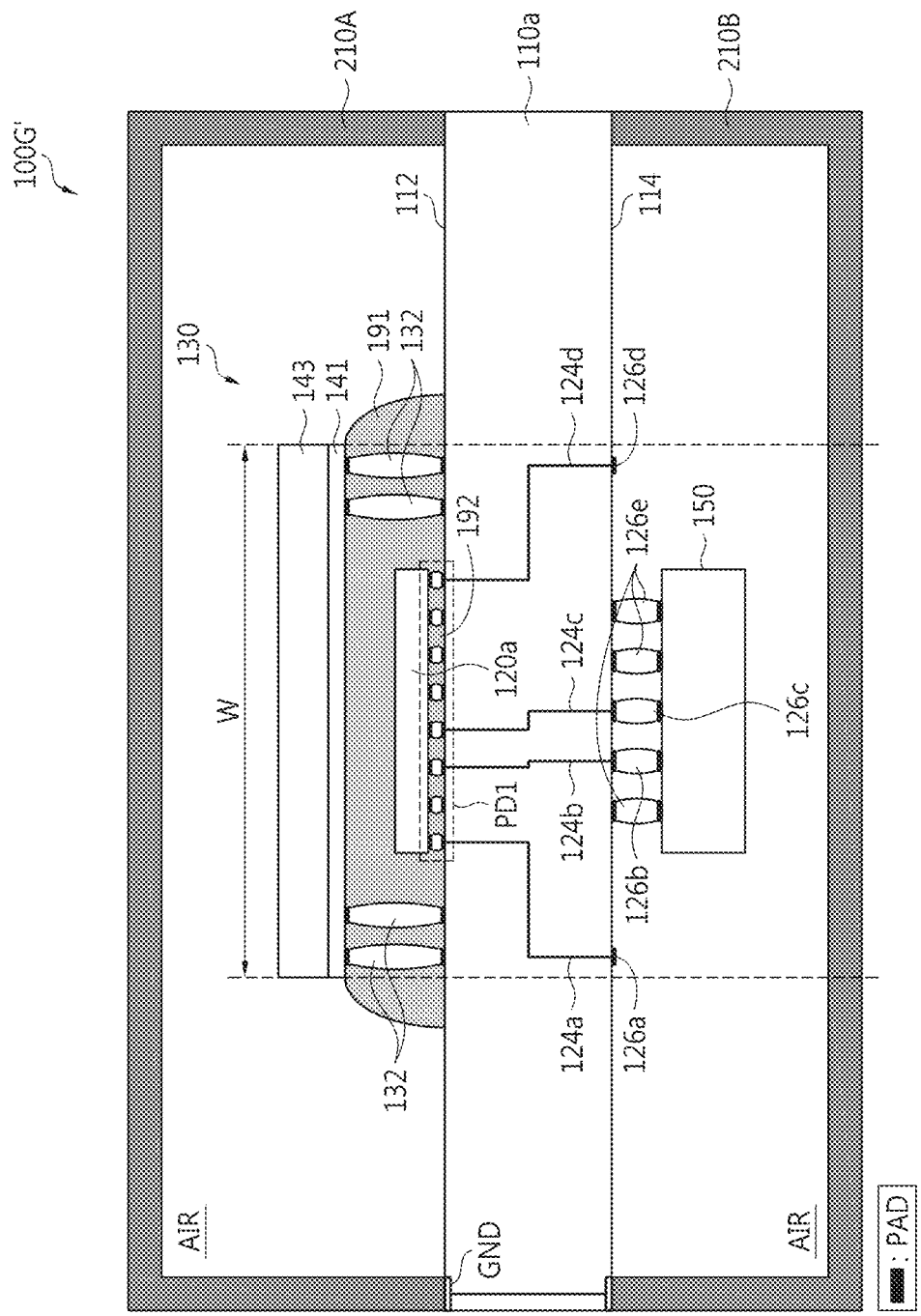

FIG. 7C schematically shows still another representative embodiment of an SoP module according to according to the inventive concept.

Referring to FIG. 7C, SoP module 100G' may include a second metal shielding material 210B in addition to the first metal shielding material 210A. The second metal shielding material 210B may protect not only the second IC 150 attached to the second side 114 but also other components 185 to 188.

The structure and function of the first metal shielding material 210A are similar to those of the second metal shielding material 210B. The second metal shielding material 210B may be connected to a ground line GND of the PCB 100a. For example, the second metal shielding material 210B and the ground line GND may be connected to each other through solder, a nonconductive paste (NCP), or material such as a nonconductive film (NCF. The space between the second side 114 of the PCB 100a and the second metal shielding material 210B may be left empty, i.e., may be air space. In the illustrated example of this embodiment, the first metal shielding material 210A and the second metal shielding material 210B are connected in common to a ground line GND.

Except for the second metal shielding material 210B, the SoP module 100G' of FIG. 7C is similar to the SoP module 100G of FIG. 7B.

Figure 8:
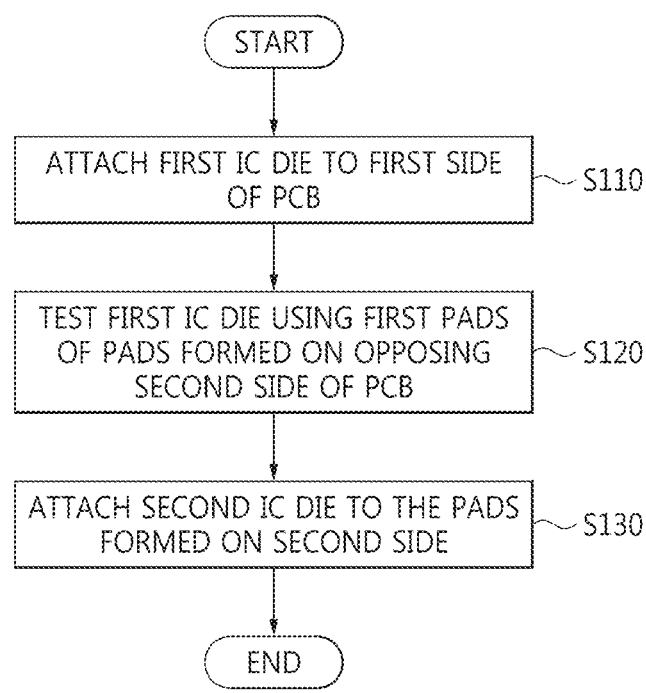
FIG. 8 is a flowchart illustrating a method of forming SoP modules according to the present inventive concept.

FIG. 8 is a flowchart which illustrates a method of forming SoP modules, according to the present inventive concept.

Referring to FIGS. 1 to 8, the first IC 120a is attached to the first side 112 of the PCB 110a, 110b, 110c, or 110d (S110). The first IC 120a may be attached to the first side 112 through the first interconnects PD1, e.g., flip-chip bumps (S110). Alternatively, the first IC 120a may be attached to the first side 112 through adhesive layer 121 and in this case, the first IC 120a may be connected to the electrical paths 124a to 124d of the PCB 110a through bonding wires 123a to 123d.

Then the first IC 120a is tested using a test device. The test device is electrically connected to the system-level assembly at this time, to test the first IC 120a, using conductors (test bumps or test pads) of the second interconnects PD2 located at the second side 114 of the PCB 110a (S120).

The test device may be any type of test device which can generate test signals testing the first IC 120a. For example, the test device may be automated test equipment (ATE).

When testing of the first IC 120a is completed, the PMIC 150 is attached to the PCB 110a, 110b, 110c, or 110d through conductors (bumps or pads) of the second interconnects PD2 (S130). As described above, some of the conductors at the second side 114 may be used for both testing the first IC 120a and attaching the PMIC 150.

Figure 9:
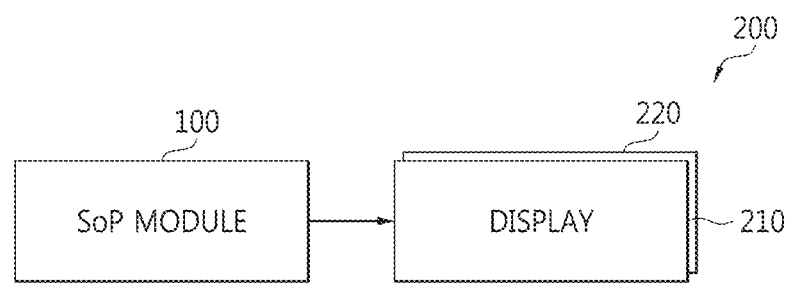
FIG. 9 shows a schematic block diagram of a mobile computing device including an SoP module according to the inventive concept.

FIG. 9 shows a mobile computing device 200 according to the inventive concept. The mobile computing device 200 may be embodied as a mobile phone, a smart phone, a tablet PC, a mobile internet device (MID), a wearable computer, a lap-top computer, an internet of things (IoT) device, or an internet of everything (IoE) device.

Referring to FIGS. 1 to 9, mobile computing device 200 includes an SoP module "100" according to the inventive concept (e.g., 100A, 100B, 100C, 100D, 100E, 100E', 100F, 100G, or 100G'), a display 210 and an input interface 220.

The display 210 may be a part of the device 200 discrete from the input interface 220, or the display 210 and the input interface 220 may be provided in essentially the form of a single part. For example, when the input interface 220 is a touch sensor, a touch panel, or a touch screen, the display 210 and the input interface 220 are essentially one and the same part of the device 200.

As described above, a first IC mounted on one side of a PCB of a system on package (SoP) module according to the inventive concept may be tested using conductors at an opposing side of the PCB. Then a second IC may be attached to the PCB using the conductors. That is, the first IC of the SoP module may be tested in a system-level assembly state.

In certain representative embodiments of an SoP module according to the inventive concept, a passive element necessary for the operation of the first IC or the second IC is located between the IC and the remaining electronic component closest to the IC. The SoP electrical path between the passive element and the IC is thus minimal in the SoP. Accordingly, a system including the SoP modules is improved in performance.

Moreover, in certain representative embodiments of an SoP module according to the inventive concept, a first IC and a second IC are disposed opposite each other across a PCB, such that the height of the SoP module may be minimal. Moreover, when the second IC is a power management IC, operation voltages output from the second IC may be immediately supplied to the first IC through the PCB, such the SoP module has enhance power characteristics.

Finally, embodiments of the inventive concept and examples thereof have been described above in detail. The inventive concept may, however, be embodied in many different forms and should not be construed as being limited to the embodiments described above. For example, features of any of the examples or embodiments may be replaced with a corresponding but different feature in another example or embodiment. Likewise, one or more features of any of the disclosed examples or embodiments may be added to another of the embodiments that lacks such a feature(s). Thus, the embodiments were described so that this disclosure is thorough and complete, and fully conveys the inventive concept to those skilled in the art. Accordingly, the true spirit and scope of the inventive concept is not limited by the embodiment and examples described above but by the following claims.

What is claimed is:

1. A system on package (SoP) module comprising:

a printed circuit board (PCB) having a first side and an opposing second side;
a first integrated circuit (IC) attached to the first side through an adhesive layer;
a second IC attached to the second side;
at least one test only pad attached to the second side outside a specified mounting area of the second IC,
wherein the PCB includes first electrical paths along which the first IC and the second IC are electrically connected, and second electrical paths along which the at least one test only pad and the first IC are electrically connected,
wherein the SoP module further includes pads on the second side of the PCB that are connected to the first electrical paths;
bonding wires electrically connecting the first IC to the first and second electrical paths at the first side of the PCB,
wherein the first IC is configured to be testable in a system-level assembly state through the pads before the second IC is attached to the second side of the PCB, and testable through the at least one test only pad after the second IC is attached to the second side of the PCB, and
wherein the pads are usable as test pads transmitting test signals for testing the first IC and also as connection pads for attaching the second IC;
a memory package which is attached to the first side of the PCB and overlying the first IC;
a first underfill material filling a space between the first IC and the memory package, the space including the bonding wires; and
an epoxy molding compound (EMC) mold protecting the first IC and the memory package,
wherein the EMC mold is coated with a shielding material for electromagnetic interference shielding.

2. The SoP module of claim 1, wherein the second IC is a power management IC (PMIC).

3. The SoP module of claim 2, wherein the PMIC is disposed within a vertical projection of the memory package.

4. The SoP module of claim 2, wherein the PMIC includes at least one of an audio codec, a wired charger, a wireless charger, a battery fuel gate, an analog-digital converter, a flash LED driver, a backlight LED driver, a RGB LED driver, a temperature compensated crystal oscillator (TCXO) buffer, a real time clock (RTC) oscillator, a back-up battery charger, and a subscriber identification module (SIM)/smart card level translator.

5. The SoP module of claim 1, wherein the first IC is one of a microprocessor, a graphics processor, a signal processor, a network processor, a chipset, an audio codec, an application processor, and a system on chip (SoC), and
the memory package includes:
one of a dynamic random access memory (DRAM), a NAND flash memory including a controller, a NOR flash memory, a ferroelectric RAM (FRAM), a phase change RAM (PRAM), and a magnetic RAM (MRAM), and at least one passive element.

6. The SoP module of claim 1, wherein the memory package includes stacked memory ICs.

7. A system-on-package (SoP) comprising:
a printed circuit board (PCB);
discrete active and passive electronic components mounted to the PCB apart from one another, each of the components being electrically connected to at least one other of the components by the PCB,
wherein the PCB has first and second opposite sides, and comprises a substrate and electrically conductive paths extending through the substrate from the first side to the second opposite side,
the active electronic components comprise a first chip disposed on the first side and attached to the PCB through an adhesive layer, and a second chip disposed on the second opposite side and attached to the PCB,
the first chip is electrically connected to the second chip through first electrically conductive paths from among the electrically conductive paths of the PCB,
wherein the PCB further comprises at least one test only pad attached to the second opposite side of the PCB outside a specific area of the second chip,
the first chip is electrically connected to the at least one test only pad through second electrically conductive paths from among the electrically conductive paths of the PCB,
the SoP has interconnections comprising conductors disposed on the substrate of the PCB at the second opposite side thereof and electrically connected to the first electrically conductive paths,
the second chip is attached to the PCB by the conductors, and is electrically connected to the first electrically conductive paths by at least some of the conductors,
whereby the first chip is configured to be testable through the conductors before the second chip is attached to the PCB, and testable through the at least one test only pad when the second IC is attached to the PCB;
bonding wires electrically connecting the first chip to the first and second electrically conductive paths at the first side of the PCB,
wherein the conductors are usable as test pads transmitting test signals for testing the first IC and also as connection pads for attaching the second IC;
a memory package which is attached to the first side of the PCB and overlying the first IC;
a first underfill material filling a space between the first IC and the memory package, the space including the bonding wires; and
an epoxy molding compound (EMC) mold protecting the first IC and the memory package,
wherein the EMC mold is coated with a shielding material for electromagnetic interference shielding.

8. The SoP of claim 7, wherein at least some of the conductors of the interconnections are electrically isolated from all of the active and passive electronic components mounted to the PCB and only attach the second chip to the PCB.

9. The SoP of claim 7, wherein the first chip is a system-on-chip (SoC).

10. The SoP of claim 9, wherein the second chip comprises a power management integrated circuit (PMIC).

11. A mobile device comprising the SoP as claimed in claim 7, a display and an interface electrically connecting the SoP to the display.

* * * * *